United States Patent [19]

Popat et al.

[11] Patent Number: 4,868,522
[45] Date of Patent: Sep. 19, 1989

[54] CLOCK SIGNAL DISTRIBUTION DEVICE

[75] Inventors: Kaushik Popat, Pleasanton; David MacMillan, Sunnyvale, both of Calif.

[73] Assignee: Gazelle Microcircuits, Inc., Santa Clara, Calif.

[21] Appl. No.: 283,686

[22] Filed: Dec. 13, 1988

[51] Int. Cl.$^4$ .................... H03B 27/00; H03L 7/06
[52] U.S. Cl. ............................... 331/2; 331/55
[58] Field of Search .............. 331/2, 55, 56, 172; 375/109; 455/51, 69

[56] References Cited

U.S. PATENT DOCUMENTS 4,411,007 10/1983 Rodman et al. ............. 455/51 X
4,497,056 1/1985 Sugamori .................... 371/25
4,577,318 3/1986 Whitacre et al. ............. 371/1

FOREIGN PATENT DOCUMENTS 55-70757 5/1980 Japan .

OTHER PUBLICATIONS

M. Johnson et al., "A Variable Delay Line Phase Locked Loop for CPU-Coprocessor Synchronization", IEEE Int. Solid-State Circuits Conference, 1988, pp. 142, 143.

Primary Examiner—David Mis
Attorney, Agent, or Firm—Skjerven, Morrill, MacPherson, Franklin & Friel

[57] ABSTRACT

A delay circit is described which automatically adjusts the propagation delay of clock signals, generated by a clock source, distributed to various receiving devices so that the receiving devices are clocked simultaneously. In one embodiment, the clock signal generated by a single clock source is independently delayed for each receiving device. To determine the proper amount of delay, a clock signal is simultaneously transmitted to each of the receiving devices and a clock return signal from each receiving device is returned to a delay circuit via a return path. The delay circuit detects the various differences in round-trip arrival times of the clock signal associated with each receiving device and fixes a particular clock signal delay for each receiving device so that subsequent clock signals will arrive at each receiving device simultaneoulsy.

19 Claims, 10 Drawing Sheets

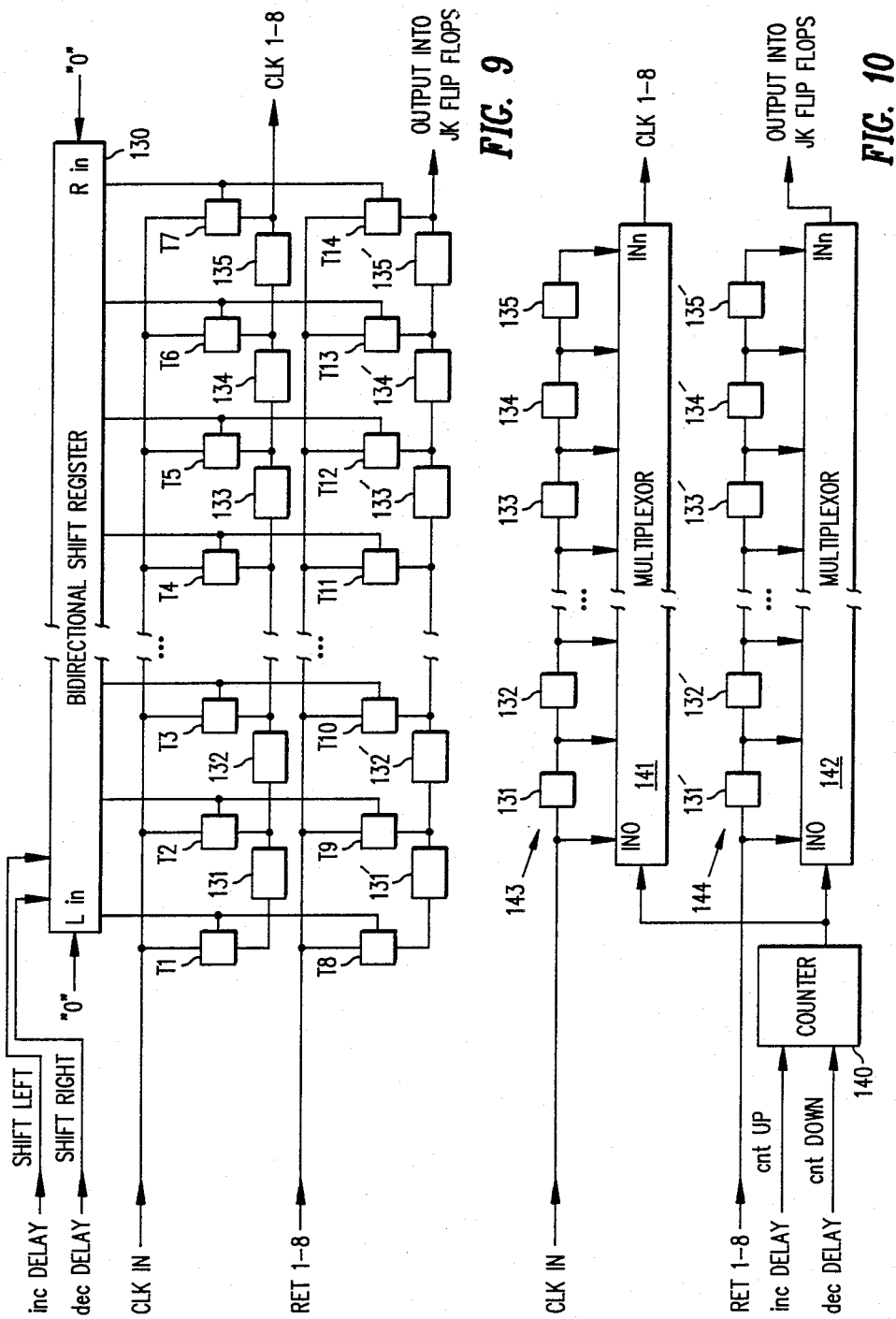

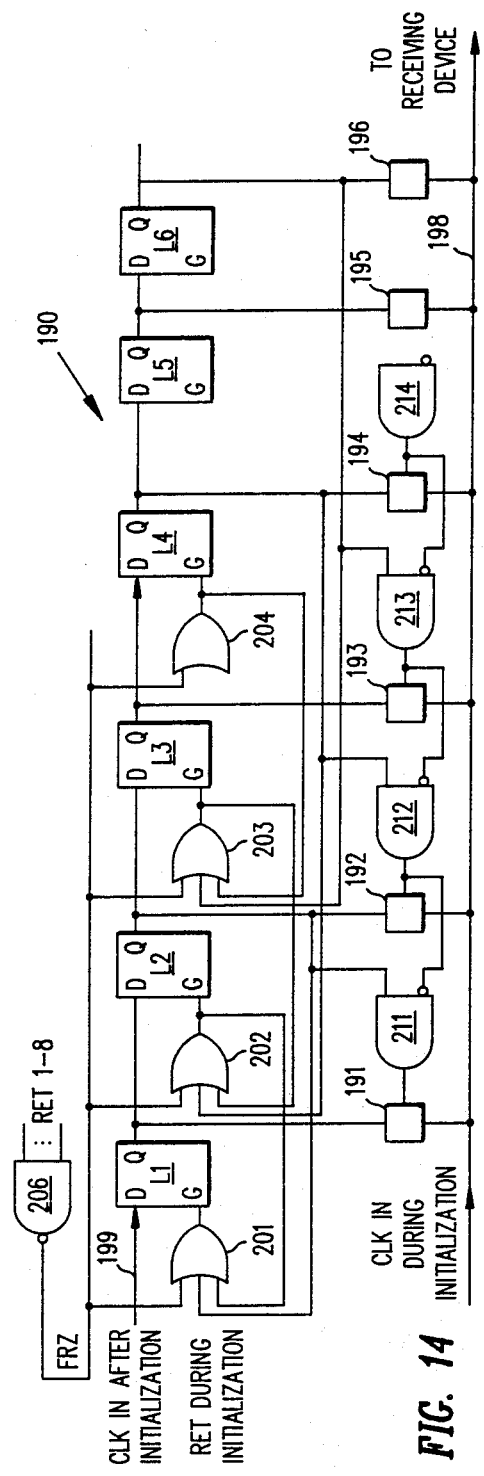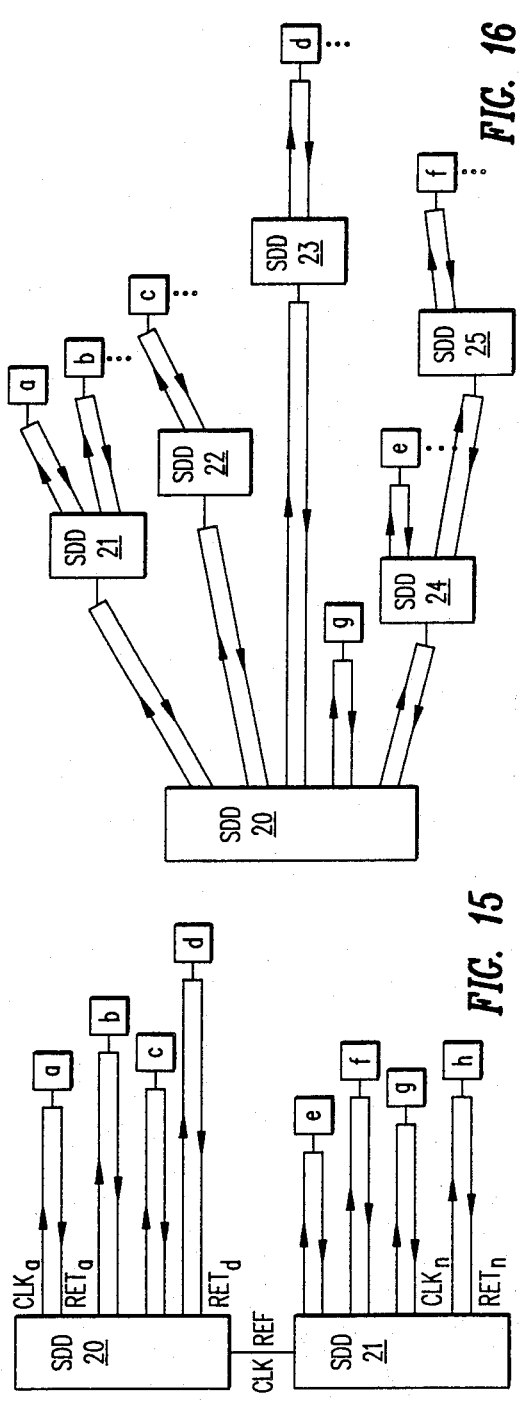

CLOCK SIGNAL DISTRIBUTION DEVICE

FIELD OF THE INVENTION

This invention relates to the distribution of clock signals to various receiving devices and in particular to a signal distribution device which deskews the clock signal propagation delays associated with each of the receiving devices.

BACKGROUND OF THE INVENTION

In a prior art configuration where a signal source, such as a clock source, provides a common signal to a number of separate receiving devices, such as gates within a single integrated circuit (IC), IC's within a single board, or separate circuit boards within a chassis, the signal generated at the output of the signal source arrives at an input port of each of the various receiving devices at various times determined by the propagation delay of the signal through the conductors coupling the signal source to the particular receiving device. Hence, the signal will most likely reach each receiving device at a slightly different time due to a different propagation delay being associated with each receiving device. This type of prior art circuit is shown in FIG. 1, where signal source 10 provides, for example, a common clock pulse to each of the receiving devices 1, 2, 3 and 4. As seen from FIG. 1, the generated clock pulse must be transmitted through a different length of conductor for each receiving device, resulting in a different signal propagation delay for each receiving device.

In general, electronic equipment which use the rise or fall of a clock pulse to initiate execution of a next instruction or a change in logic states is able to absorb a range of clock pulse propagation delays wherein the first receiving device to receive a clock pulse is not affected by the delay incurred by the longer propagation delay associated with a more distant receiving device. However, higher clock rates are ultimately constrained by the magnitude of the range of signal propagation delays when the receiving devices must communicate with each other or transmit a reply back to a common device, such as a microprocessor, where the microprocessor makes a decision based on the concurrent inputs of two or more receiving devices. Considering that the propagation speed through a copper conductor is approximately 0.5 feet per nanosecond and the length of conductor between one receiving device and another may be several feet, and also considering that propagation delay is further increased by capacitances and inductances along the wire, it can easily be understood how logic designers must take into account the various propagation delays between a clock source and the receiving devices when determining a maximum clock rate. Additionally, allowable range of propagation delays is severely limited when each receiving device requires a different time to execute an instruction initiated by the clock pulse and the concurrent outputs of the receiving devices must be further processed by, for example, a microprocessor.

As market demand for computing power seems insatiable, computer systems (especially PC's and workstations) continue to get more and more powerful which, today, is usually accomplished by reducing the system's average instruction cycle time. This means using fewer clock cycles per instruction and/or using a faster clock. With the emergence of processors which approach one instruction per clock, future advances in system performance will continue to depend on increasing the system clock frequency. However, system clock frequency remains constrained by the range of propagation delays between the clock source and the receiving devices.

SUMMARY OF THE INVENTION

My invention is a delay circuit which automatically adjusts the propagation delay of clock signals, generated by a clock source, distributed to various receiving devices so that the receiving devices are clocked simultaneously. By doing so, clock frequencies can generally be increased up to 20%.

In this inventive delay circuit, the clock signal generated by a single clock source is independently delayed for each receiving device. In one embodiment of my invention, to determine the proper amount of delay, a clock signal is simultaneously transmitted to each of the receiving devices, and a clock return signal from each receiving device is returned to a delay circuit, via a return path having a propagation delay substantially matched to the clock transmission path. The delay circuit detects the various differences in round-trip arrival times of the clock signal associated with each receiving device and fixes a particular clock signal delay for each receiving device so that subsequent clock signals will arrive at each receiving device simultaneously.

The delay circuit can be made dynamic, enabling constant calibration of the delay circuit, or static, wherein the delay for each receiving device is calibrated only at specified calibration times.

BRIEF DESCRIPTION OF THE DRAWINGS

FIGS. 3-14 show various embodiments of my signal distribution device.

FIG. 15 is a block diagram showing how to cascade two or more signal distribution devices to deskew signals transmitted to a large number of receiving devices.

FIG. 16 shows another embodiment of a cascade configuration.

DETAILED DESCRIPTION

Figure 1:
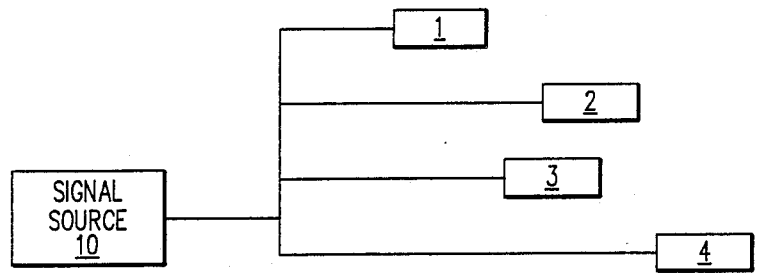
FIG. 1 is a prior art circuit showing a signal source and various receiving devices coupled to the signal source.
Figure 2:
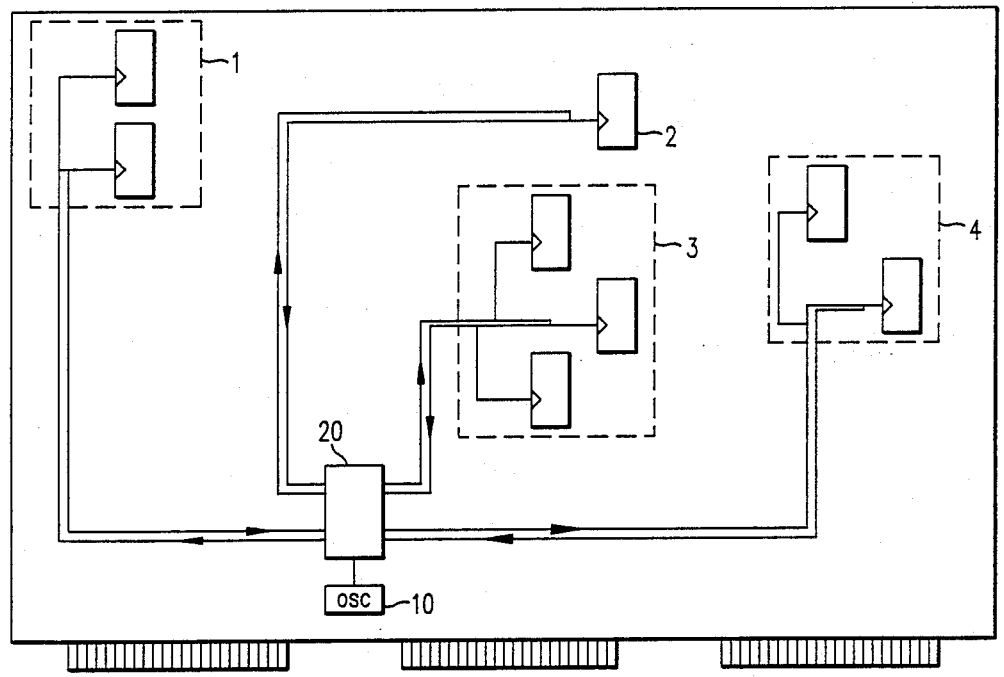
FIG. 2 is a diagram of my invention showing a signal source and various receiving devices coupled to my signal distribution device.

FIG. 2 illustrates one embodiment of my invention showing signal source 10, producing a periodic pulse, for example, a clock pulse, whose output is coupled to an input of signal distribution device (SDD) 20. SDD 20 contains a plurality of delay elements, each delay element being associated with a particular output port of SDD 20 and each delay element being able to provide an independent time delay to a clock signal produced by signal source 10. In FIG. 2, four receiving devices 1, 2, 3 and 4 are shown on a single circuit board, each receiving device being coupled to an associated delay element within SDD 20 by a clock transmit line, designated by an arrow pointing toward the receiving device, and a clock return line, designated by an arrow pointing away from the receiving device. The clock transmit lines and corresponding clock return lines inherently cause substantially identical propagation delays. In FIG. 2, receiving devices 1, 3, and 4 each comprise a plurality of IC's located proximate to one another and, hence, each IC within a single receiving device experiences similar clock propagation delays. The delay elements operate to independently delay the clock signals so that the clock signals arrive at all receiving devices simultaneously despite differences in propagation delays.

Figure 3:
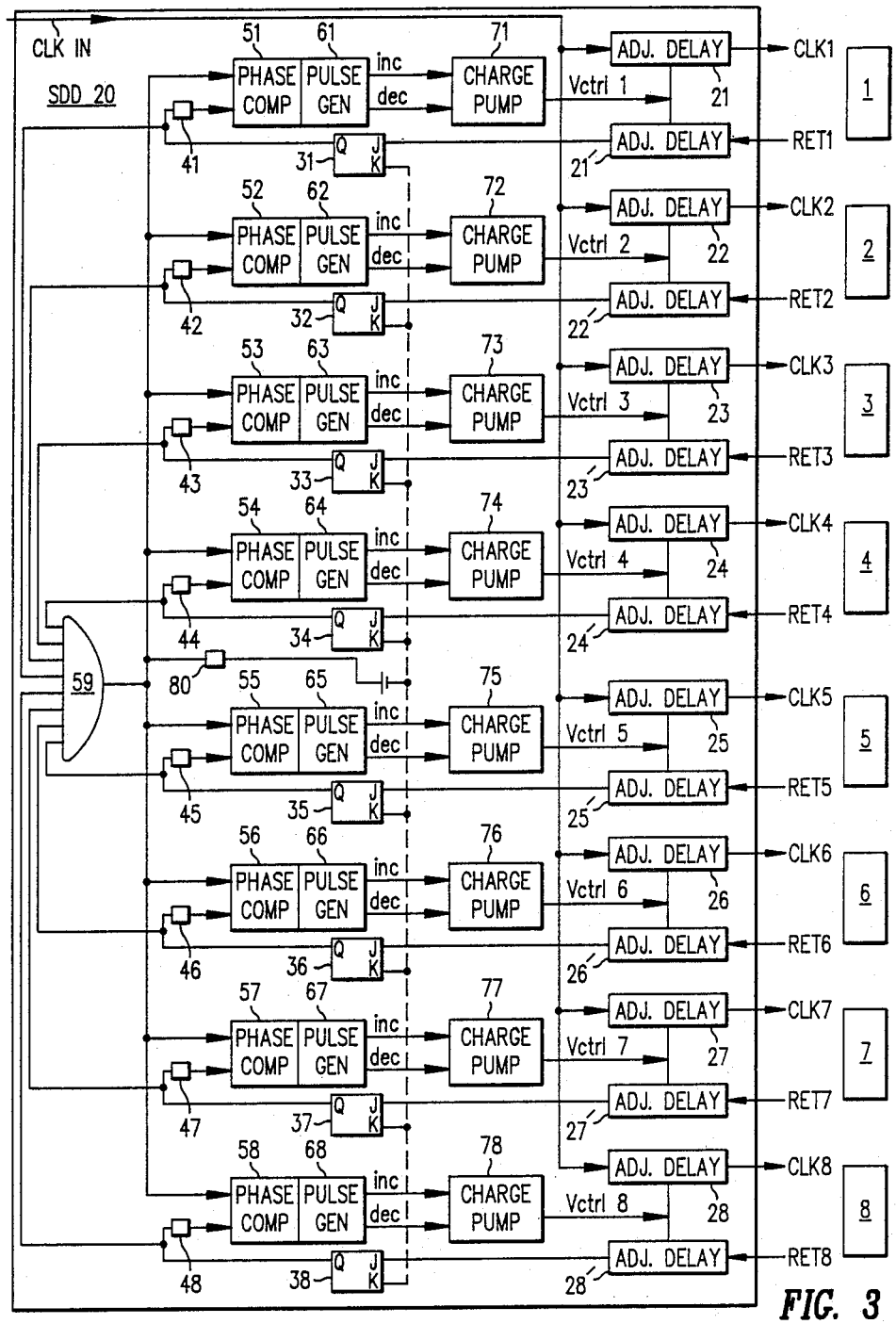

Operation of SDD 20 will be described with reference to various specific embodiments of SDD 20 shown in FIGS. 3-14. FIG. 3 shows a preferred embodiment of SDD 20, wherein independently delayed clock signals CLK 1-8 are coupled via an associated clock transmit line to receiving devices 1-8, respectively, wherein each receiving device 1-8 may be gates within a single IC, IC's within a single circuit board, a single circuit board, or a plurality of boards or devices located proximate to one another and requiring similar propagation delays. Clock return signals RET 1-8 are coupled to associated inputs of SDD 20, clock return signals RET 1-8 being clock signals CLK 1-8 returning from receiving devices 1-8, respectively, via an associated clock return line. Clock transmit and return lines are similar to those shown in FIG. 2 wherein the propagation delay for a clock transmit line is essentially identical to the propagation delay for the corresponding clock return line.

Applied to an input of SDD 20 is a periodic clock signal CLK IN generated by a signal source, such as signal source 10 in FIG. 2. Clock signal CLK IN is commonly applied to the inputs of adjustable delay elements 21-28. Each adjustable delay element 21-28 provides at its output an appropriately delayed clock signal CLK 1-8, respectively, which is then applied via a clock transmit line to an associated receiving device 1-8.

The returned clock signals RET 1-8 from associated receiving devices 1-8 are applied to an input of an associated adjustable delay element 21'-28', each delay element 21'-28' having a delay precisely matched to adjustable delay element 21-28, respectively.

Each delayed output of delay elements 21'-28' is then applied to the "set" (or J) input of an associated J-K flip flop 31-38 to set the state of the Q output of the associated J-K flip flop 31-38 to a HIGH level when a delayed clock return signal RET 1-8 is outputted by an associated delay element 21'-28'. The Q output of each flip flop 31-38 is coupled to a fixed delay element 41-48, respectively, (gates may be used as fixed delay elements) and the output of each fixed delay element 41-48 is coupled to a first input of an associated phase comparator 51-58. All fixed delay elements 41-48 have identical delays. The functions of the various elements will be discussed later.

The Q outputs of all J-K flip flops 31-38 are also applied to an associated input of AND gate 59, whose output is commonly coupled to a second input of phase comparators 51-58. The output of AND gate 59, therefore, goes HIGH when all clock return signals RET 1-8, after being delayed by an associated adjustable delay element 21'-28' have triggered J-K flip flops 31-38 to be in their HIGH state. Fixed delay elements 41-48 have a delay equal to or greater than the delay of AND gate 59 so that the HIGH output of AND gate 59 will occur coincident or slightly before the last delayed clock return signal RET 1-8 is applied to the first input of its associated phase comparator 51-58.

Thus, inputted into each phase comparator 51-58 will be:

(1) a first input being the slightly delayed output of an associated J-K flip flop 31-38, going HIGH as each RET 1-8 signal is received and delayed by delay elements 21'-28', respectively, and (2) a second input (i.e., AND gate 59 output) going HIGH after the last J-K flip flop has been triggered, and after a fixed delay inherent in AND gate 59.

Hence, the output of each phase comparator 51-58 will correspond to the difference in time between when the last J-K flip flop has triggered (i.e., triggering of a HIGH output of AND gate 59) and the time an associated clock return signal RET 1-8 has been applied to the phase comparator. If each adjustable delay element pair 21-28 and 21'-28' are adjusted identically so that both first and second inputs into each phase comparators 51-58 occur simultaneously, then each adjustable delay element 21-28 plus its associated clock transmit line provides identical propagation delays to the CLK IN signal. This is clearly understood by realizing that if the CLK IN signal is applied simultaneously to all inputs of delay elements 21-28 and all delayed clock return signals RET 1-8 are outputted by delay elements 21'-28' simultaneously, then, given that the total propagation delay (including propagation delay provided by an associated adjustable delay element) of the clock transmit path associated with each receiving device is identical to its associated return path, the transmitted clock signals CLK 1-8 must have been received by each receiving device 1-8 simultaneously.

In FIG. 3, adjustable delay elements 21-38 and 21'-28' are adjusted in discrete steps by the below described elements. The phase comparators 51-58 used in FIG. 3 may be well known D flip flops. If phase comparators 51-58 are D flip flops, the clock input terminal of the D flip flop will be coupled to the output of AND gate 59, and the "D" input terminal of the D flip flop will be coupled to the output of an associated fixed delay element 41-48. Referring to FIG. 3, a HIGH "up" signal (e.g., a HIGH Q output of a D flip flop) is generated by phase comparators 51-58 when a HI Goutput of fixed delay elements 41-48, applied to a first input of a phase comparator, is leading a HIGH output of AND gate 59 applied to a second input of the phase comparator. Phase comparators 51-58 output a HIGH "down" signal (e.g., a HIGH $\overline{Q}$ output of a D flip flop) when a HIGH output of fixed delay elements 41-48 lags a HIGH output of AND gate 59.

To cause incremental adjustments to adjustable delay elements 21-28 and 21'-28', pulse generators 61-68 are coupled to the up and down outputs of phase comparators 51-58, respectively, and generate at an "increment" output a fixed pulse width signal for every up pulse outputted by its associated phase comparator and generate at a "decrement" output a fixed pulse width signal for every down pulse outputted by its associated phase comparator, hence, making the width of the pulses outputted by phase comparators 51-58 irrelevant.

Figure 4:
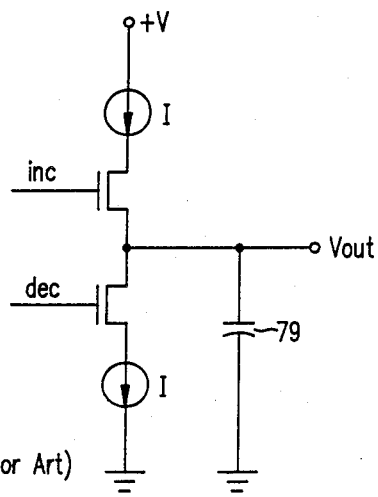

The increment and decrement pulses are applied to respective input ports of a charge pump 71-78 associated with each phase comparator. A simplified charge pump is shown in FIG. 4 where an increment pulse causes capacitor 79 to charge with a current I for the increment pulse interval and discharge a current I during the decrement pulse interval. Thus, the output of charge pump 71-78 will be a voltage whose magnitude is dependent upon the number of total increment pulses minus the number of total decrement pulses. The outputs of charge pumps 71-78, shown as control voltages Vctrl 1-8, are coupled to respective pairs of adjustable delay elements 21-28 and 21'-28' to control their respective delays, with a larger Vctrl signal causing an increased delay.

Thus, control voltage Vctrl 1-8 will rise to a level to keep the two waveforms applied to the first and second inputs of phase comparators 51-58 arriving in-phase.

Fixed delay 80 coupled between the output of AND gate 59 and the reset inputs of J-K flip flops 31-38 causes J-K flip flops 31-38 to reset shortly after each clock cycle.

Figure 5:
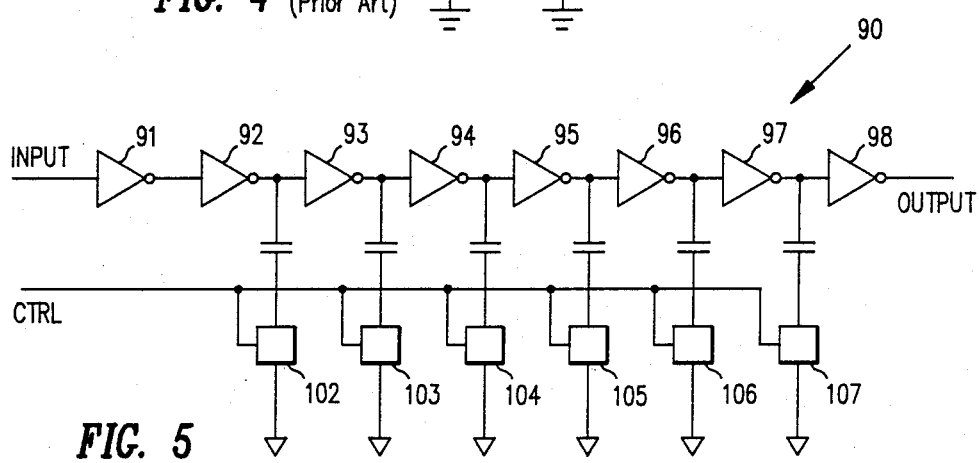

One embodiment of a single adjustable delay element which may be used as delay elements 21-28 and 21'-28' is shown in FIG. 5. In FIG. 5, voltage controlled delay (VCD) 90 is shown being comprised of inverters 91-98 forming a delay line. Inverters 91-98 may be any type of gate having an inherent delay. The total delay of the delay line is dependent on the loads 102-107 coupled to the outputs of inverters 91-98, with an increased load causing the delay provided by each inverter 91-98 to increase. The control voltage provided by charge pump 71-78 adjusts the resistances of loads 102-107 equally and causes the delay line to have a corresponding delay.

Thus, FIG. 3 shows SDD 20 as a dynamic clock deskewing circuit which uses analog delay lines with fixed size delay steps. This dynamic deskewing circuit updates the various adjustable elements on each clock cycle so that delayed clock signals CLK 1-8 arrive at each of the receiving devices simultaneously.

Figure 7:
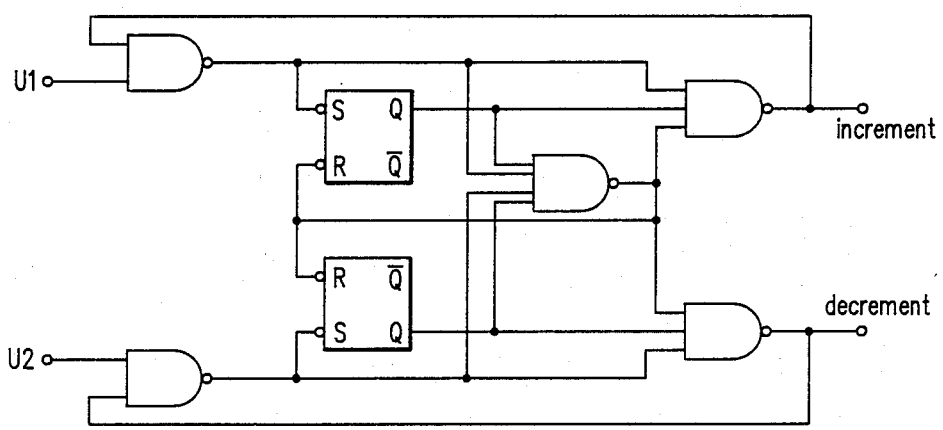
Figure 6:
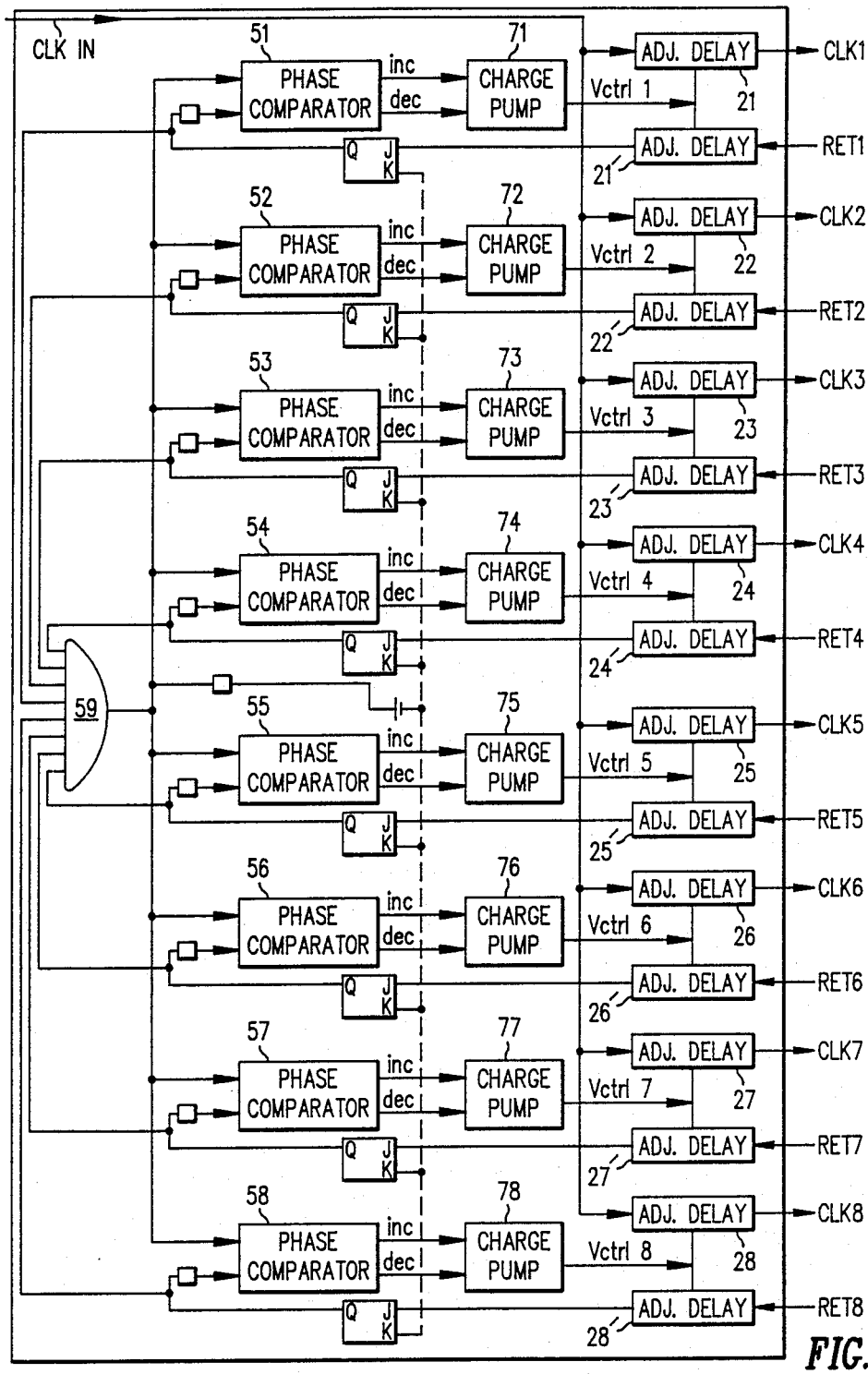

In another embodiment of SDD 20 in FIG. 2, similar to the dynamic deskewing circuit of FIG. 3, pulse generators 61-68 of FIG. 3 may be deleted, as shown in FIG. 6, and a well known type phase comparator, such as shown in FIG. 7, may be used for phase comparators 51-58. The phase comparator of FIG. 7 outputs an increment pulse or a decrement pulse having a pulse width corresponding to the difference in phase of the two waveforms applied to its first and second input terminals, U1 and U2, respectively. The modulated pulse width increment and decrement outputs of phase comparators 51-58, indicating the extent of leading or lagging of the waveforms applied to the first and second inputs of phase comparators 51-58, may be directly used to control charge pumps 71-78 to output a control voltage Vctrl 1-8 necessary to properly adjust delay elements 21-28 and 21'-28'. When delay elements 21-28 and 21'-28' are properly adjusted there will be no further incrementing or decrementing of charge pumps 71-78, and clock signals CLK 1-8 will be arriving at their associated receiving devices simultaneously. All other elements and their operations are identical to corresponding elements in FIG. 3.

Figure 8:
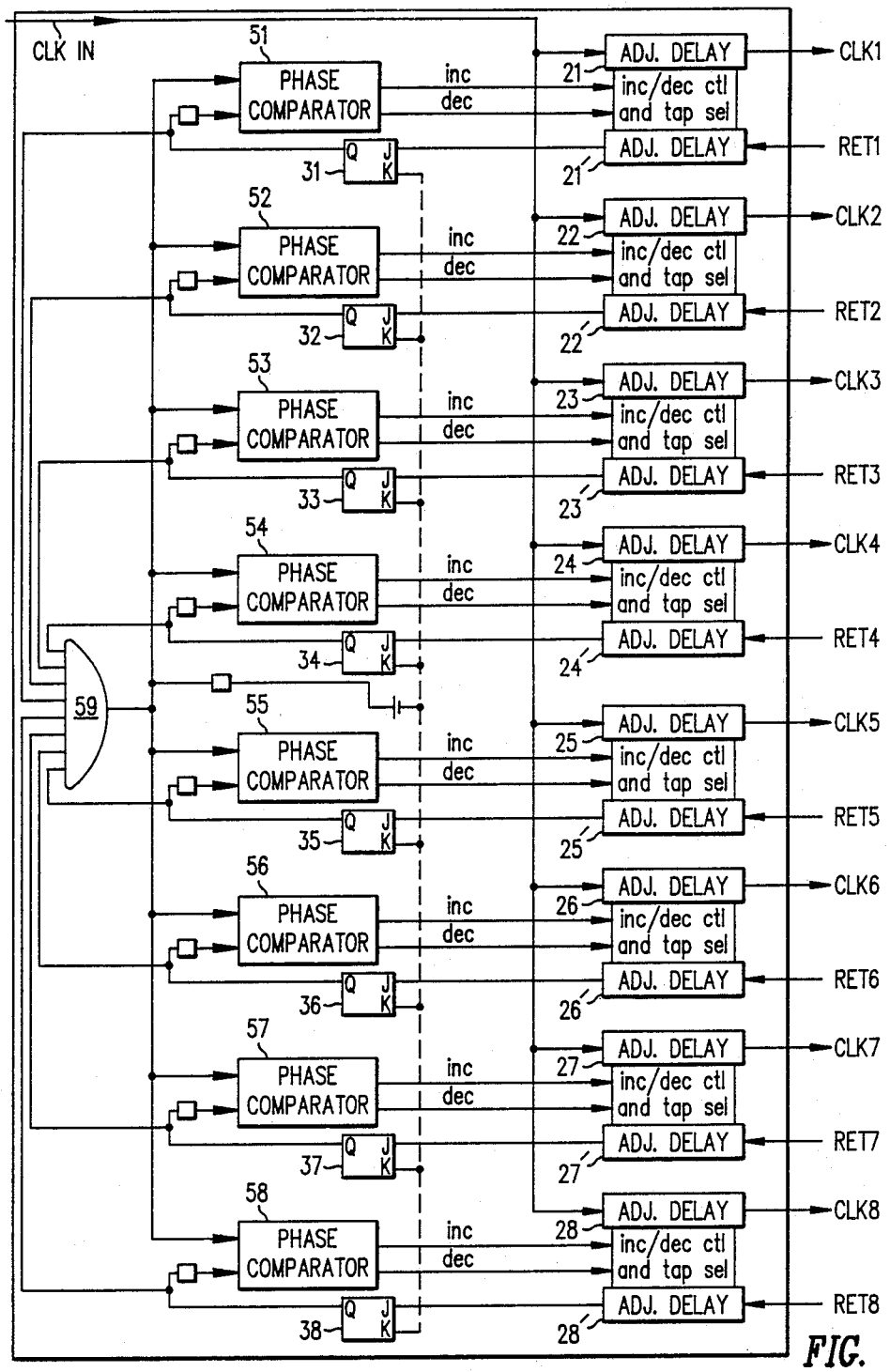

FIG. 8 shows another embodiment of SDD 20 in FIG. 2 which is also similar to the dynamic deskewing circuit of FIG. 3. In the deskewing circuit of FIG. 8, as in the circuit of FIG. 3, phase comparators 51-58 are used to indicate whether the delayed J-K flip flop 31-38 output into a first input of phase comparators 51-58 leads or lags the output of AND gate 59 applied to a second input of phase comparators 51-58. If the delayed J-K flip flop 31-38 output leads the output of AND gate 59 an "increment" pulse for each clock cycle will be applied to the control terminals of an associated pair of delay elements 21-28 and 21'-28'. Conversely, if the delayed J-K flip flop 31-38 output lags the output of AND gate 59, a "decrement" pulse will be applied to the control terminals. In this embodiment, adjustable delay elements 21-28 and 21'-28' are digitally controlled wherein the delay provided depends on the total number of increment pulses minus the total number of decrement pulses.

One embodiment of delay elements 21-28 and 21'-28' for use in the embodiment of FIG. 8 is shown in FIG. 9, wherein an increment pulse causes a "1" at an output of bidirectional shift register 130 to be shifted to the left and a decrement pulse causes the "1" at the output of shift register 130 to be shifted to the right. Fixed delay elements 131-135 form a first delay line to delay clock signal CLK IN, while fixed delay elements 131'-135' form a second delay line to delay clock return signals RET 1-8. The position of the "1" determines at which fixed delay element 131-135 and 131'-135' input the CLK IN and RET 1-8 signals are to be applied. The "1" outputted by shift register 130, in one embodiment, may be used to selectively switch MOS transistors T1-T14 coupled between the inputs of fixed delay elements 131-135 and 131'-135' and the CLK IN and RET 1-8 signals.

FIG. 10 shows another embodiment of a digital delay line which can be used in the deskewing circuit of FIG. 8. In FIG. 10, the increment pulses (count up) and decrement pulses (count down) are counted by counter 140, where the output of counter 140 thus reflects the total number of increment pulses minus decrement pulses. The output of counter 140 controls a pair of multiplexers 141 and 142 to select a tap off delay lines 143 and 144 where each delay element 131-135 and 131'-135', comprising delay lines 143 and 144, respectively, provides a fixed delay.

Figure 11:
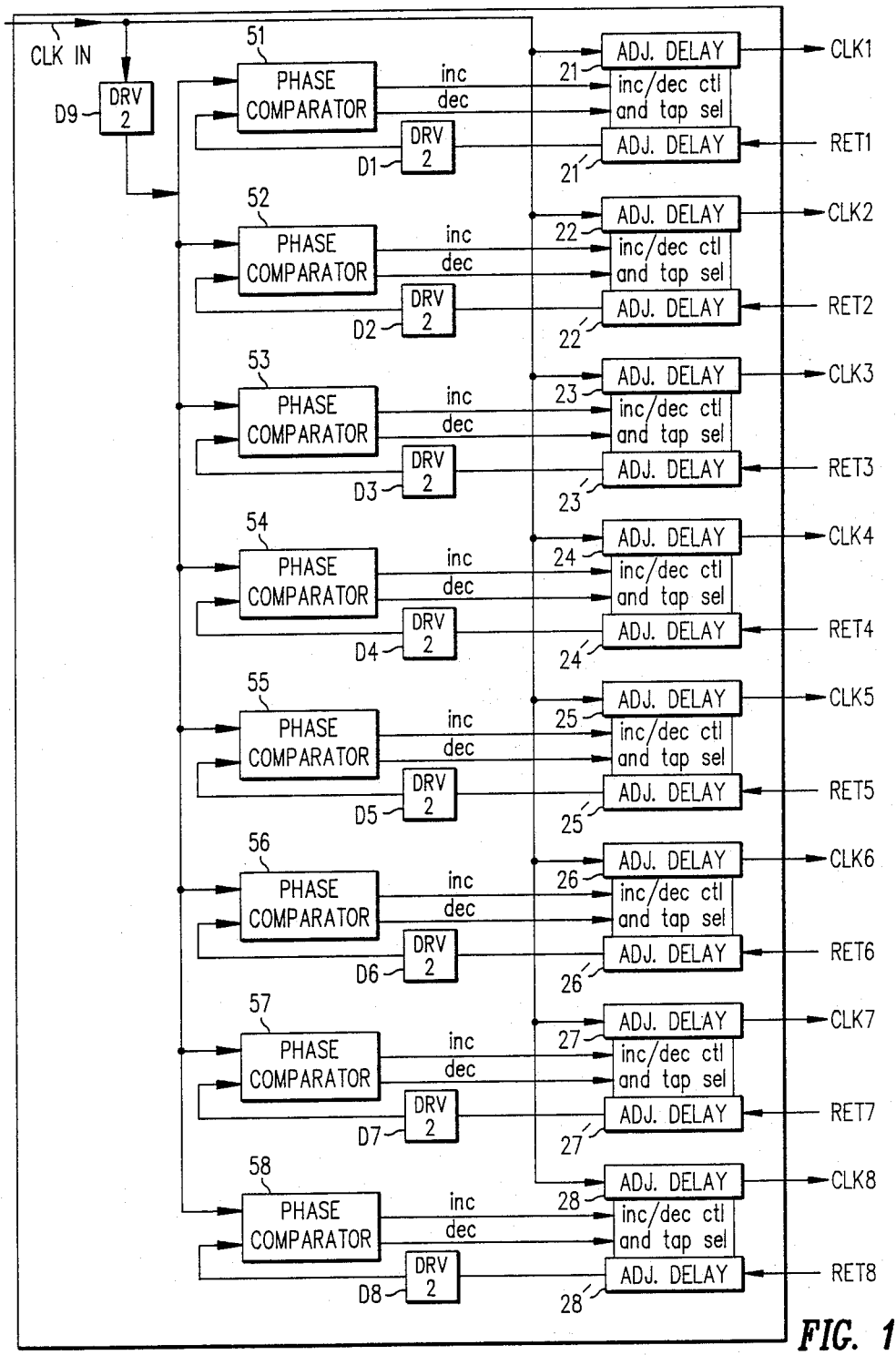

FIG. 11 shows another embodiment of SDD 20 in FIG. 2, wherein the delays of adjustable delays 21-28 and 21'-28' are determined relative to the next CLK IN signal as opposed to relative to the last received RET 1-8 signal as in the embodiments of FIGS. 3, 7 and 8. In FIG. 11, each of phase comparators 51-58 compare a one-half frequency CLK IN signal to a one-half frequency delayed RET 1-8 signal. Adjustable delays 21-28 and 21'-28' will automatically be adjusted to bring the one-half frequency CLK IN signal in phase with the one-half frequency delayed RET 1-8 signals similar to the deskewing device of FIG. 8. Each divide-by-two element D1-D9 in FIG. 11 may be a T flip flop where each HIGH input into the T flip flop causes a change of state at its output. The deskewing circuit of FIG. 11 is well adapted for use where multi-phase clock signals are to be deskewed or when the signal distribution device is to be cascaded as in FIG. 16, which will be discussed later. In this usage, each of the multi-phase clock signals is applied to a different deskewing circuit identical to that of FIG. 11. Each phase of the clock signals will arrive at all receiving devices simultaneously and the various clock signals will arrive in-phase since the propagation delays are adjusted relative to the phases of the clock signals.

Figure 12:
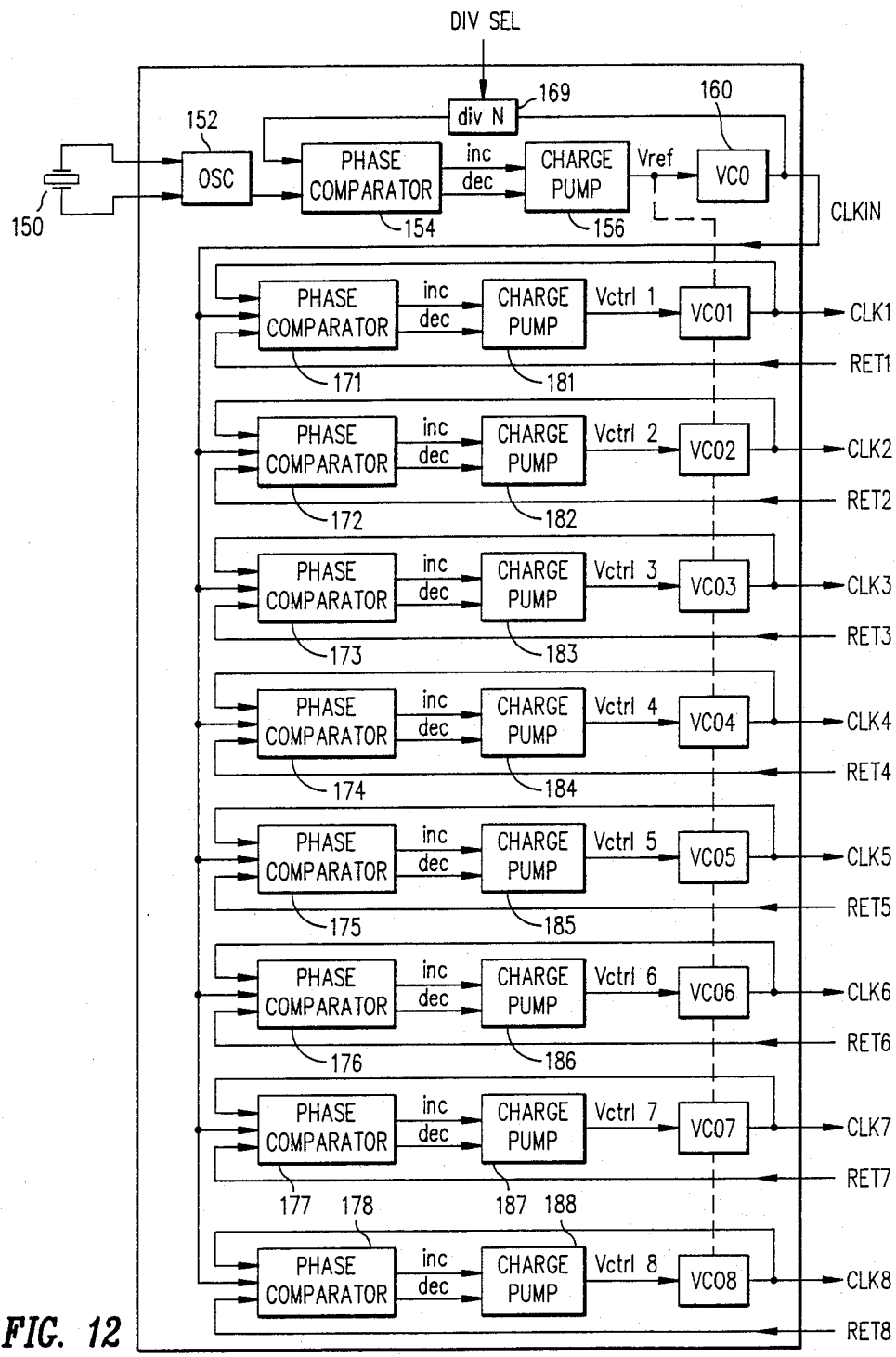

FIG. 12 shows an embodiment of a deskewing circuit using voltage controlled oscillators (VCO's) 1-8 to independently generate clock signals for application to an associated receiving device. In this embodiment, a signal source comprising crystal 150 and oscillator 152 applies a first clock signal to a first input of phase comparator 154. The output of phase comparator 154 increments or decrements the output of charge pump 156 whose output, Vref, controls the frequency of VCO 160. A phase locked loop is created by applying to a second input of phase comparator 154 a divided output of VCO 160, which is controlled by Vref to output an oscillating voltage which, when divided by divider 169, is in-phase with the output of oscillator 152. This Vref is commonly applied to VCO's 1–8 to cause VCO's 1–8 to output a signal in-phase with the output of VCO 160 (i.e., CLK IN) if control voltages Vctrl 1–8, adjusting the outputs of VCO's 1–8 are zero. When control voltages Vctrl 1–8 are a desired positive value, the respective phases of VCO's 1–8 are pushed ahead so that their outputs arrive at their associated receiving devices (not shown), coupled to the outputs of VCO's 1–8, simultaneously. To accomplish this result, the outputs of each VCO 1–8 (i.e., CLK 1–8, respectively), along with an associated clock return signal RET 1–8 returning from an associated receiving device, are each applied to respective inputs of phase comparators 171–178; the CLK IN signal is applied to a reference input of each phase comparator 171–178. The outputs of phase comparators 171–178 increment or decrement the output of charge pumps 181–188, respectively, so as to keep the reference CLK IN signal lagging the CLK 1–8 signal, associated with each phase comparator 171–178, and leading the RET 1–8 signal by the same amount. Thus, once this relationship has been established, for every increment pulse applied to charge pumps 181–188 caused by RET 1–8 lagging CLK IN, there will be a decrement pulse caused by CLK 1–8 leading CLK IN.

Since the CLK 1–8 signals each arrive at their respective receiving devices at the midpoint between when CLK 1–8, generated by VCO's 1–8, are applied to phase comparators 171–178 and when RET 1–8 are received by phase comparators 171–178, and this midpoint corresponds to the time CLK IN is commonly applied to all phase comparators 171–178, the CLK 1–8 arrives at all receiving devices simultaneously.

Divider 169 coupled between CLK IN and phase comparator 154 is used to select a CLK IN frequency which is a selected multiple of the frequency of oscillator 152.

Figure 13:
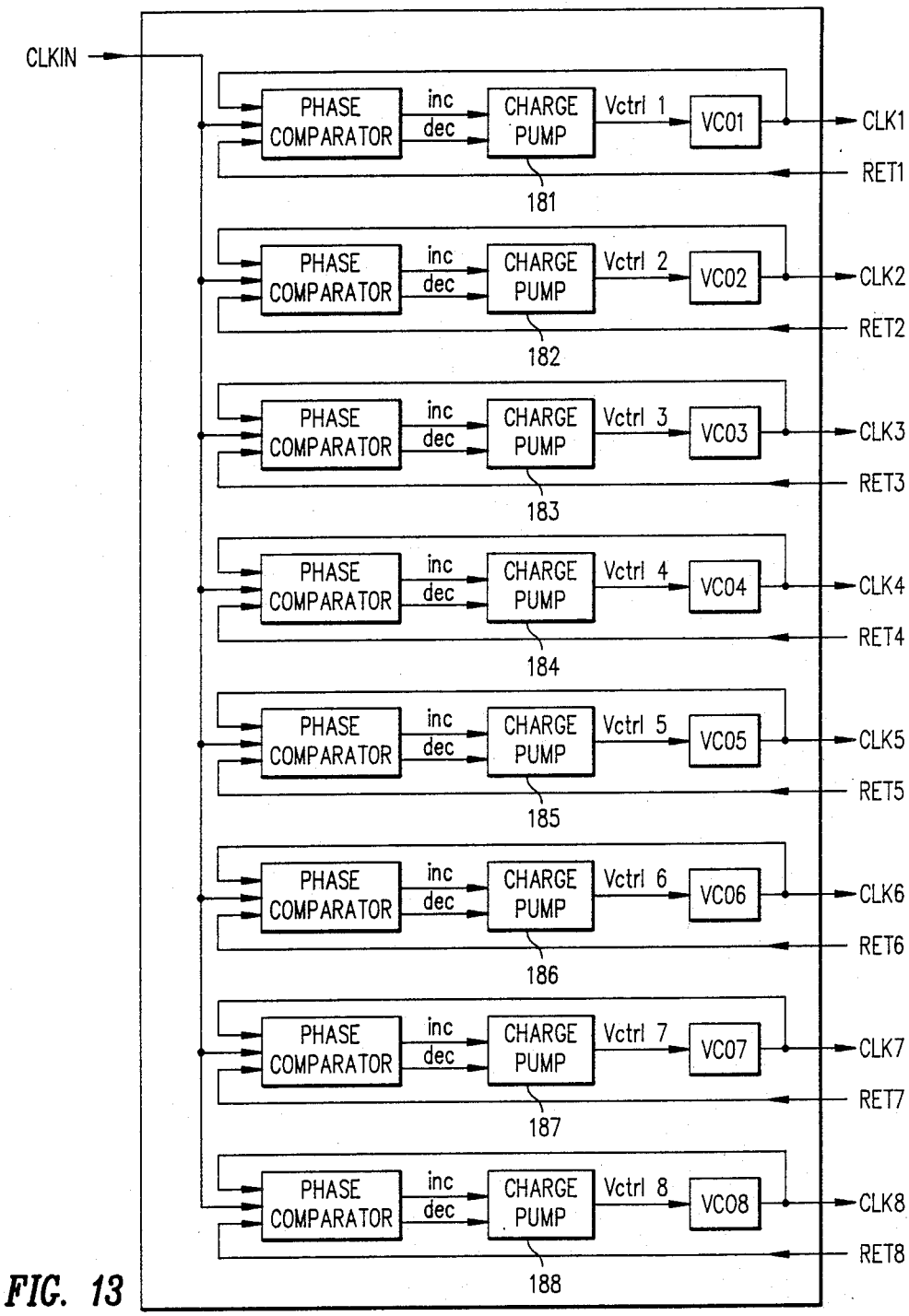

In another embodiment, shown in FIG. 13, there is no reference voltage applied to Vctrl 1–8 for VCO's 1–8 to set a center frequency, and the output of charge pumps 181–188 rise to set the proper control voltages VCO's 1–8. This takes a bit longer for VCO's 1–8 to become balanced as compared with the embodiment of FIG. 12. All other components in FIG. 13 operate identically to corresponding components in FIG. 12.

FIG. 14 shows another embodiment of SDD 20 in FIG. 2, where SDD 20 comprises a plurality of delay elements identical to static delay element 190 in FIG. 14, and where a delay element identical to delay element 190 is associated with each receiving device coupled to SDD 20 in FIG. 2.

Static delay element 190 comprises a tapped delay line comprising latches L1–L6 couples in series, although more latches may be added as necessary. Latches L1–L6 may be D type latches where an input signal into the latch appears at the output Q after a short inherent fixed delay.

The outputs of latches L1–L6 are coupled to a first terminal of an associated MOS transistor 191–196, with a second terminal of transistors 191–196 coupled to clock transmit line 198. A clock input signal CLK IN is applied to the input of latch L1 so that, depending on which transistor 191–196 is conductive, CLK IN will undergo a particular delay before being applied to clock transmit line 198.

Enable ports G of latches L1–L4 have applied to them an output of an associated OR gate 201–203, respectively. The OR gates act to enable only the latches through which CLK IN must propagate to achieve the proper delay so that all delayed clock signals, delayed by a delay element identical to delay element 190 and associated with a particular receiving device, applied to respective clock transmit lines will arrive at all receiving devices simultaneously.

A first input to OR gates 201–204 is freeze signal FRZ, which goes low when all clock return signals (RET 1–8, assuming eight receiving devices) have returned from all receiving devices. FRZ is the output of NAND gate 206 having input signals being clock return signals RET 1–8. Hence, when the last clock return signal is received, FRZ will go low.

A second input into OR gates 201–203 is the output of a latch which is 2X latches downstream. For example, an input into OR gate 201 associated with latch L1 is the output of L2, and an input into OR gate 202 associated with latch L2 is the output of L4. Thus, when FRZ is low, a HIGH output at a latch 2X latches downstream continues to enable the latch upstream even though the particular latch 2X downstream is itself disabled and, therefore, fixed in the HIGH state.

A third input into OR gates 201–203 is the enable signal G of the next latch downstream so that all latches upstream from an enabled latch will be also enabled.

Thus, once the FRZ signal goes low, the only latches that remain enabled are the first half of the latches which were triggered to a HIGH state by a signal propagating through the series combination of latches.

To set the proper delay of delay element 190, clock return signal RET is coupled to the input (line 199) of the delay line comprising latches L1–L6 so that when, in an initialization step, CLK IN is directly applied to clock transmit line 198 and returned as RET via a return line, the clock return signal RET associated with each receiving device will propagate down the delay line until FRZ goes low to disable the last half of the latches through which clock return signal RET has propagated.

Since the number of latches clock return signal RET has propagated through before FRZ goes low is related to the total propagation delay of the clock transmit line and the clock return line, half that number of latches represents the propagation delay of the clock transmit line.

The control terminals of transistors 191–194 are coupled to the outputs of AND gates 211–214 who each have one input coupled to a latch output 2X downstream and an inverted input coupled to the control terminal of a transistor one transistor downstream. Thus, only one of transistors 191–194 will be turned on, and that transistor will be that at the output of the furthest latch downstream which is enabled.

After this initialization step, the FRZ signal is maintained at a low level, the clock return line is disconnected from input 199 of the delay line, and CLK IN is applied to the input of the delay line 199. The result being that the delay of clock signal CLK IN provided by the enabled latches before CLK IN is coupled to clock transmit line 198 causes all clock signals CLK 1–8 (assuming eight delay elements in SDD 20) to arrive at all receiving devices 1–8 simultaneously.

When an updated propagation delay is desired, all latches are reset and the initialize stage is repeated.

FIG. 15 shows a way to cascade a plurality of signal distribution devices (SDD's). In FIG. 15, SDD's 20 and 21 are placed relatively close together and the arrival of the clock return signal RET$_{a-h}$ with the longest propagation delay (RET$_d$ in the particular configuration of FIG. 15) causes a signal CLK REF to be commonly applied to all of the SDD's, in this case SDD's 20 and 21, so that all delays provided by delay elements within the various signal distribution devices may be referenced to this longest propagation delay. Hence, all independently delayed clock signals CLK$_{a-h}$ will be applied to all receiving devices (shown as a-h) simultaneously. This method of cascading is well suited for the signal distribution devices of FIGS. 3, 6, 8, and 14, where the delay is made relative to the return signal with the longest propagation delay.

FIG. 16 is another embodiment of a method to cascade a plurality of SDD's when the number of receiving devices require more than one SDD 20. This method of cascading is well suited for the signal distribution devices of FIGS. 11, 12, and 13, where the delay is made relative to a CLK IN pulse. In FIG. 16, receiving device g along with signal distribution devices 20, 21, 22, 23, and 24 are shown coupled to an output of central SDD 20. In this embodiment, another SDD may be used as a receiving device so that each delayed clock output signal from central SDD 20 causes a clock signal to be simultaneously applied to each of SDD's 21, 22, 23, and 24 and receiving device g. Each of SDD's 21, 22, 23, and 24 then acts independently to output clock signals with various delays to simultaneously arrive at the various receiving devices, including SDD 25, coupled to respective outputs of SDD's 21–24. Since each of SDD's 20–25 causes an incoming clock signal to be delayed one clock cycle before arriving at the respective receiving devices coupled to the outputs of SDD's 20–25, the clock signal applied to receiving device g will be exactly two cycles ahead of the clock signal applied to receiving device f, receiving device f being coupled to SDD 20 through both SDD's 24 and 25.

In FIGS. 2–16, as an alternative to providing separate return paths for the various clock return RET signals, the clock transmit CLK signals applied to the various receiving devices may each return to the signal distribution device along the same conductor which was used to transmit the CLK signal by employing reflection of the CLK signal at an impedance discontinuity at the input of the receiving device.

Thus, a clock deskewing device has been shown which eliminates any constriction of clock frequency due to differing propagation delays associated with a plurality of receiving devices. With the elimination of these propagation delay differences, clock frequencies may be increased, even up to 20% higher, with little redesign of existing networks. Further, design constraints imposing a narrow range of propagation delays between a clock source and a receiving device may be relaxed due to the ability to automatically provide simultaneous clocking to all receiving devices.

It will be obvious to those skilled in the art to make changes to the various embodiments described herein for various purposes while still keeping within the scope of my invention—that being the sensing of relative propagation delays by the utilization of a return signal from a receiving device and controlling individual delay elements or VCO's associated with each receiving device so that signals delayed by the delay elements or signals generated by the VCO's are applied simultaneously to all receiving devices.

We claim:

1. A signal distribution device for applying a transmit signal simultaneously to a plurality of receiving devices comprising:
   a plurality of first adjustable delay elements each having an input signal to be applied to said receiving devices and each having an output for coupling a transmit signal to an associated one of said receiving devices;
   a plurality of second adjustable delay elements identical to said plurality of first delay elements, each of said second delay elements being associated with one of said first delay elements, each of said second delay elements having an input for receiving a return signal returning from each of said receiving devices and each having an output; and
   a plurality of detecting means each coupled to an output of an associated second delay element for detecting relative propagation delays, a particular propagation delay being associated with each receiving device, of said transmit signal as said transmit signal is communicated from said signal distribution device to each of said receiving devices and back to said signal distribution device as said return signal and for providing a plurality of control signals for application to said first and second delay elements, wherein each of said control signals identically controls an associated pair of first and second delay elements to delay said transmit signal an amount necessary for said transmit signal to arrive at all of said receiving devices simultaneously.

2. The signal distribution device of claim 1 wherein each of said detecting means comprises a phase comparator for detecting phase differences between signals outputted from said second delay elements and a frequency divided input signal.

3. The signal distribution device of claim 1 further comprising a sensing means having inputs coupled to said outputs of said second delay elements, said sensing means for sensing a signal with a longest propagation delay and applying a sense signal to each of said detecting means, said relative propagation delays associated with each receiving device being determined when said sense signal is applied to said detecting means.

4. The signal distribution device of claim 3 wherein each of said detecting means comprises a phase comparator for detecting phase differences between signals outputted from said second delay elements and said sense signal.

5. The signal distribution device of claim 4 wherein said first and second delay elements each comprise a voltage controlled delay formed by a serial combination of gates forming a delay line wherein each of said phase comparators controls an increase or decrease in a load resistance coupled to outputs of the various gates comprising the delay line in order to increase or decrease the delay provided by the delay line.

6. The signal distribution device of claim 2 or 4 wherein each of said first and second delay elements comprises a bidirectional shift register having applied to a shift-left input and a shift-right input of said bidirectional shift register an output of an associated one of said phase comparators, said bidirectional shift register selecting a tap off of two identical delay lines.

7. The signal distribution device of claim 2 or 4 wherein each of said first and second delay elements comprises a counter having a count-up input coupled to a first output of an associated phase comparator and a count-down input coupled to a second output of said associated phase comparator, wherein an output of said counter controls multiplexer means to select a tap off of two identical delay lines.

8. The signal distribution device of claim 4 wherein an output of each of said phase comparators is coupled to a charge pump, wherein said charge pump provides said control signals for identically controlling said associated pair of first and second delay elements.

9. The signal distribution device of claim 4 where said signal having a longest propagation delay is controlled to have virtually no delay provided by said first and second delay elements.

10. The signal distribution device of claim 2 or 4 wherein said transmit signal is communicated from said signal distribution device to each of said receiving devices via a first conductive path and said return signal is communicated back to said signal distribution device via a second conductive path.

11. The signal distribution device of claim 2 or 4 wherein said transmit signal is communicated from said signal distribution device to each of said receiving devices via a first conductive path and said return signal is communicated back to said signal distribution device also via said first conductive path, and wherein said receiving devices exhibit an impedance discontinuity to said signal distribution device so that said transmit signal is reflected back to said signal distribution device.

12. The signal distribution device of claim 2 or 4 wherein said input signal is a periodic clock signal.

13. A signal distribution device for applying a transmit signal simultaneously to a plurality of receiving devices comprising:
a plurality of voltage controlled oscillators, each associated with one of said receiving devices, for applying said transmit signal to an associated one of said receiving devices;
a plurality of detecting means each having a first input port coupled to receive a return signal from an associated receiving device, a second input port coupled to an output of an associated voltage controlled oscillator, and a third input port coupled to receive an input clock signal for detecting relative propagation delays, a particular propagation delay being associated with each receiving device, of said transmit signal as said transmit signal is communicated from said signal distribution device to each of said receiving devices and back to said signal distribution device as a return signal and for providing a control signal for application to an associated voltage controlled oscillator, wherein each of said control signals controls an associated voltage controlled oscillator to generate said transmit signal for application to each of said receiving devices so that said transmit signal arrives at each of said receiving devices simultaneously.

14. The signal distribution device of claim 13 wherein said detecting means is a phase comparator which provides increment and decrement signals to a charge pump whose output provides control voltages for an associated one of said plurality of voltage control oscillators.

15. A signal distribution device for applying a transmit signal simultaneously to a plurality of receiving devices comprising:
a plurality of identical series combinations of latches forming delay lines, a first terminal of each of said delay lines coupled to receive a common input signal;
switch means coupled to each of said delay lines for selecting a tap off an associated delay line in response to a relative propagation delay of an associated transmit signal after returning as a return signal from an associated one of said receiving devices so that a transmit signal applied to each of said receiving devices from an associated tapped delay line will arrive at each of said receiving devices simultaneously.

16. The signal distribution device of claim 15 wherein said series combination of latches and said switch means are configured so that in an initialization phase said return signal will propagate down each of said delay lines and trigger a first number of latches until all return signals have been received by said signal distribution device from said receiving devices, wherein triggering of said first number of latches causes said switch means to tap off an output of a latch which is half of said first number of latches between said first terminal and said first number of latches triggered by said return signal.

17. A method for applying a plurality of transmit signals simultaneously to a plurality of receiving devices irrespective of differing propagation delays between sources of said transmit signals and said receiving devices comprising:
detecting relative propagation delays, a particular propagation delay being associated with each receiving device, of said transmit signals as said signal are communicated from a signal distribution device to each of said receiving devices and back to said signal distribution device as return signals; and
providing a plurality of control signals based on said relative propagation delays for application to a plurality of delay elements, each delay element being associated with a receiving device, wherein each of said control signals controls an associated delay element to delay said transmit signal an amount necessary for said transmit signal to arrive at all of said receiving devices simultaneously.

18. The method of claim 17 wherein said transmit signal acts as a periodic clock signal.

19. A method for applying a plurality of transmit signals simultaneously to a plurality of receiving devices irrespective of different propagation delays between sources of said transmit signals and said receiving devices comprising:
detecting relative propagation delays, a particular propagation delay being associated with each receiving device, of said transmit signals as said transmit signals are communicated from a signal distribution device to each of said receiving devices and back to said signal distribution device as return signals; and
providing a plurality of control signals based on said relative propagation delays for application to a plurality of voltage controlled oscillators, each voltage controlled oscillator being associated with a receiving device, wherein each of said control signals controls an associated voltage controlled oscillator to provide delayed transmit signals of an amount necessary for said transmit signals to arrive at all of said receiving devices simultaneously.

* * * * *